United States Patent
Hsu et al.

(10) Patent No.: US 9,972,599 B2
(45) Date of Patent: May 15, 2018

(54) PACKAGE STRUCTURE AND METHOD OF MANUFACTURING THE SAME

(71) Applicant: PHOENIX PIONEER TECHNOLOGY CO., LTD., Hukou Township (TW)

(72) Inventors: Shih-Ping Hsu, Hukou Township (TW); Chao-Chung Tseng, Hukou Township (TW)

(73) Assignee: PHOENIX PIONEER TECHNOLOGY CO., LTD., Hukou Township, Hsinchu County (TW)

( * ) Notice: Subject to any disclaimer, the term of this patent is extended or adjusted under 35 U.S.C. 154(b) by 240 days.

(21) Appl. No.: 14/558,955

(22) Filed: Dec. 3, 2014

(65) Prior Publication Data
US 2015/0359096 A1    Dec. 10, 2015

(30) Foreign Application Priority Data
Aug. 4, 2014    (TW) .............................. 103126538 A

(51) Int. Cl.
*H05K 1/18* (2006.01)
*H01L 25/065* (2006.01)
(Continued)

(52) U.S. Cl.
CPC ...... *H01L 25/0657* (2013.01); *H01L 21/6835* (2013.01); *H01L 23/5389* (2013.01); *H01L 24/17* (2013.01); *H01L 24/81* (2013.01); *H01L 25/16* (2013.01); *H01L 25/50* (2013.01); *H05K 1/183* (2013.01); *H05K 3/4682* (2013.01); *H05K 3/4697* (2013.01); *H01L 21/486* (2013.01);
(Continued)

(58) Field of Classification Search
CPC .... H05K 1/185; H05K 2201/10; H05K 1/162; H05K 2201/10007; H05K 2201/10015; H05K 2201/10022; H05K 2201/1003; H05K 2201/10037; H05K 3/284
USPC .......................... 361/791–764; 257/787–792
See application file for complete search history.

(56) References Cited

U.S. PATENT DOCUMENTS 5,562,971 A * 10/1996 Tsuru .................. H01L 21/4857
                                                   174/255
7,030,502 B2 * 4/2006 Chang .................... H01L 23/13
                                                   257/778
(Continued)

*Primary Examiner* — Binh Tran
(74) *Attorney, Agent, or Firm* — Steptoe & Johnson LLP

(57) ABSTRACT

A method of manufacturing a package structure is provided, including forming a first wiring layer on a carrier board, forming up plurality of first conductors on the first wiring layer, forming a first insulating layer that encapsulates the first wiring layer and the first conductors, forming a second wiring layer on the first insulating layer, forming a plurality of second conductors on the second wiring layer, forming a second insulating layer that encapsulates the second wiring layer and the second conductors, and forming at least an opening on the second insulating layer for at least one electronic component to be disposed therein. Since the first and second insulating layers are formed before the opening, there is no need of stacking or laminating a substrate that already has an opening, and the electronic component will not be laminated and make a displacement. Therefore, the package structure thus manufactured has a high yield rate. The present invention further provides the package structure.

12 Claims, 6 Drawing Sheets

(51) Int. Cl.
  H01L 23/00   (2006.01)
  H01L 21/683  (2006.01)
  H01L 25/16   (2006.01)
  H01L 25/00   (2006.01)
  H01L 23/538  (2006.01)
  H05K 3/46    (2006.01)
  H01L 23/28       (2006.01)
  H01L 23/29       (2006.01)
  H05K 3/00        (2006.01)
  H01L 23/498      (2006.01)
  H01L 21/48       (2006.01)
  H05K 1/16        (2006.01)
  H05K 3/28        (2006.01)
  H01L 23/50       (2006.01)
  H05K 1/02        (2006.01)
  H05K 3/34        (2006.01)

(52) U.S. Cl.
  CPC ........ *H01L 23/49827* (2013.01); *H01L 23/50* (2013.01); *H01L 2221/68345* (2013.01); *H01L 2224/131* (2013.01); *H01L 2224/16227* (2013.01); *H01L 2224/16235* (2013.01); *H01L 2924/15153* (2013.01); *H01L 2924/15331* (2013.01); *H01L 2924/19041* (2013.01); *H01L 2924/19042* (2013.01); *H01L 2924/19043* (2013.01); *H01L 2924/19105* (2013.01); *H05K 1/0231* (2013.01); *H05K 1/162* (2013.01); *H05K 1/185* (2013.01); *H05K 3/0032* (2013.01); *H05K 3/0044* (2013.01); *H05K 3/284* (2013.01); *H05K 3/3431* (2013.01); *H05K 2201/10* (2013.01); *H05K 2201/1003* (2013.01); *H05K 2201/10007* (2013.01); *H05K 2201/10015* (2013.01); *H05K 2201/10037* (2013.01); *H05K 2201/10545* (2013.01); *Y10T 29/49131* (2015.01)

(56) References Cited

U.S. PATENT DOCUMENTS

| | | | | |
|---|---|---|---|---|
| 2011/0241203 | A1* | 10/2011 | Nakasato | H01L 21/563 257/737 |
| 2013/0219712 | A1* | 8/2013 | Suzuki | H05K 3/284 29/841 |
| 2014/0185257 | A1* | 7/2014 | Hsu | H05K 3/4697 361/761 |

* cited by examiner

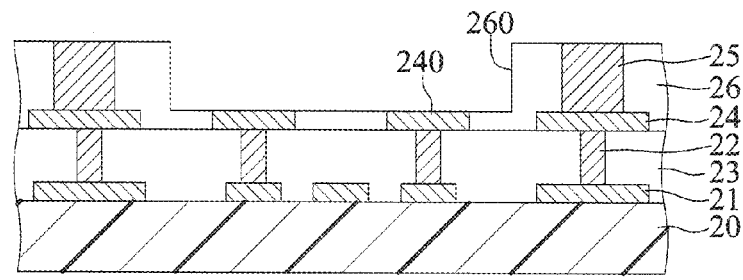
FIG.2E
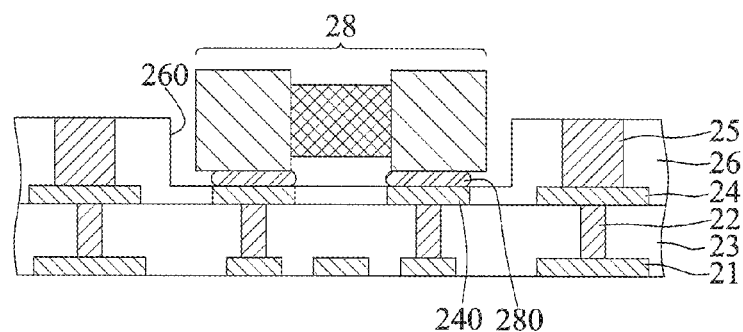
FIG.2F
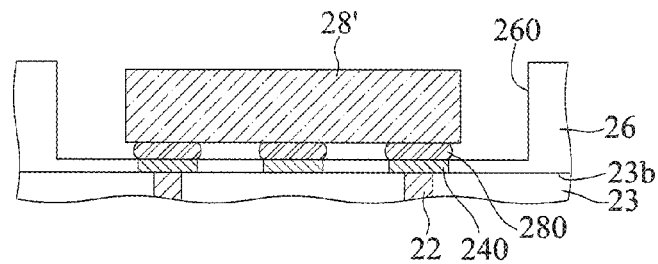
FIG.2F'
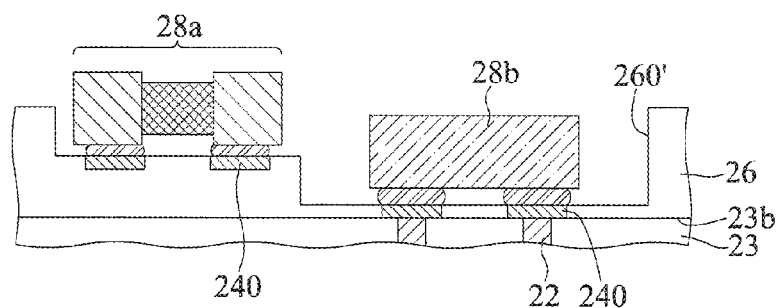
FIG.2F"

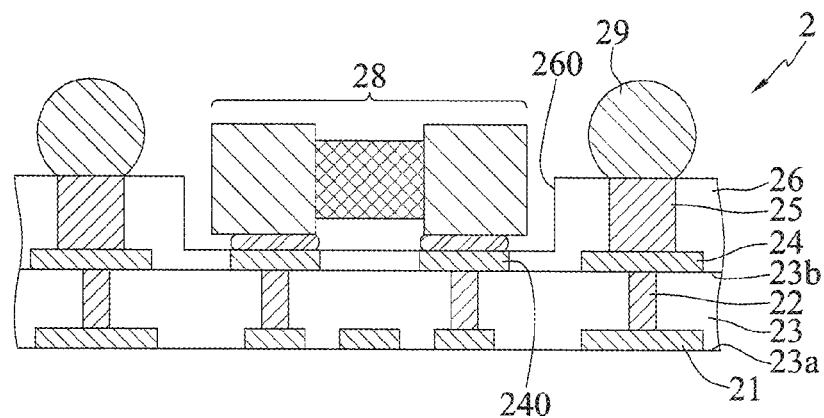
FIG.2G
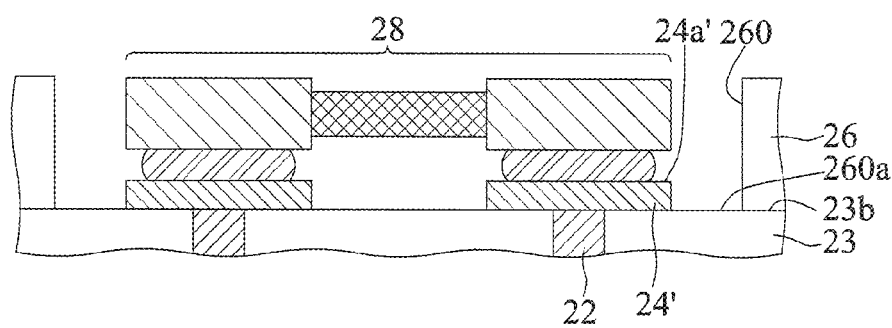
FIG.2G'
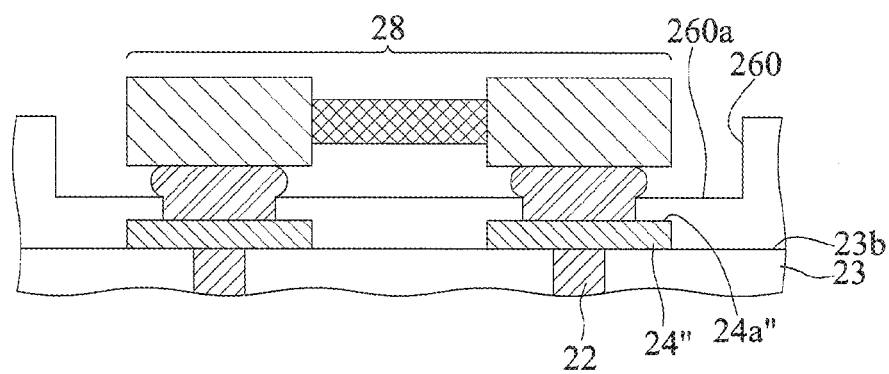
FIG.2G"

PACKAGE STRUCTURE AND METHOD OF MANUFACTURING THE SAME

BACKGROUND OF THE INVENTION

1. Field of the Invention

The present invention relates to package structures, and, more particularly, to a package structure for preventing electromagnetic interferences, and a method of manufacturing the package structure.

2. Description of Related Art

With the advancement in the technology of semiconductor package, different package structures have been developed to be incorporated in the smart phones, tablets, internet, laptops, and such semiconductor device is formed by mounting a chip on a package substrate such that the semiconductor chip is electrically connected thereto, and then followed by an encapsulating process to complete the formation of the semiconductor device. In addition, a package with an embedded chip which has the chip embedded in a package substrate is developed so as to reduce the overall thickness of the semiconductor package. Such semiconductor package is gaining popularity as it has the advantages of reduced size as well as improved electronic performance.

FIGS. 1A to 1D are cross-sectional views showing a conventional package structure 1. As shown in FIG. 1A, a core board 13 having an opening 130 penetrating therethrough is prepared. A plurality of inner wirings 11 and a copper window 110 are formed on upper and lower sides of the core board 13. A plurality of conductive pillars 12 are formed in the core board 13 are electrically connected with the inner wirings 11.

As shown in FIG. 1B, a carrier board 10 is disposed on a bottom side of the core board 13. Polyimide (PI) adhesive tapes secure a semiconductor chip 18 having a plurality of electrode pads 180 to be accommodated in the opening 130. The semiconductor chip 18 is disposed on the carrier board 10. Through the design of the copper window 110, the semiconductor chip 18 can be prevented from making contact with the inner wirings 11.

As shown in FIG. 1C, a dielectric layer is laminated on an upper side of the core board 13 and on the semiconductor chip 18. A dielectric material fills a gap between a wall of the opening 130 and the semiconductor chip 18. The carrier board 10 is then removed. Another dielectric material is laminated on the bottom side of the core board 13. The two dielectric materials form a dielectric material layer 16.

As shown in FIG. 1D, two wiring layers 14 are formed on the upper and lower sides of the dielectric material layer 16, respectively. The wiring layer 14 has conductors 15 disposed in the dielectric material layer 16 and electrically connected with the electrode pads 180 and the inner wirings 11.

However, in the manufacturing process of the conventional package structure 1, since the copper window 110 is used as a blocking layer, the inner wirings 11 have a layout area that is reduced. Besides, as the opening 130 is formed by a $CO_2$ laser process, the package structure 1 has a high cost, and organic fiberglass of the core board 13 is likely exposed therefrom. Therefore, the package structure 1 has a low yield rate and poor quality.

Blind holes (that are formed where the conductors 15 are disposed) or vias (that are formed where the conductive pillars 12 are disposed) are required to be formed by a laser process. The blind holes and vias thus formed can be circular only, and have poor quality.

PI tapes are used to secure the semiconductor chip 18 to the carrier board 10. The attachment and detachment of the PI tapes to and from the carrier board 10 adversely increase the overall cost of the package structure 1.

Furthermore, two dielectric materials are required to be laminated to form the dielectric material layer 16. The additional lamination and cure process increase the overall cost and time required to manufacture the package structure 1, and may lead to displacement of the semiconductor chip 18 (or even rotation). Therefore, it is difficult to precisely position the semiconductor chip 18 in the opening 130, and the electrode pads 180 of the semiconductor chip 18 are inaccurately aligned with the conductors 15. As a result, the electrical connection is poor, and the package structure 1 thus has a low yield rate.

FIGS. 1A' to 1D' are cross-sectional views showing a method of manufacturing another conventional package structure 1'.

As shown in FIG. 1A', a first wiring layer 11' is formed on the carrier board 10 such as a copper coil substrate, and a passive component 18' such as a multi-layer ceramic capacitor (MLCC) is secured on the first wiring layer 11' via an insulating adhesive material 180. As shown in FIG. 1B', a first dielectric material layer 13' having a penetrating opening 130 is formed on the carrier board 10, and a passive component 18' is received in the opening 130.

As shown in FIG. 1C', a second dielectric material layer is laminated on the upper side of the first dielectric material layer 13' and on the passive component 18', and fills a gap between a wall of the opening 130 and the passive component 18'. The first dielectric material layer 13' and the second dielectric layer to form a dielectric encapsulating layer 16' that encapsulates and secures the passive component 18' and the first wiring layer 11'.

As shown in FIG. 1D', a second wiring layer 14' is formed on the upper side of the dielectric encapsulating layer 16'. The second wiring layer 14' has conductors 15 disposed in the dielectric encapsulating layer 16' and electrically connected with the passive component 18'. Subsequently, the carrier board 10 is removed to expose the first wiring layer 11'.

In the conventional package structure 1', since the copper coil substrate is used as the carrier board 10, it is easy to cause delamination, and the package structure 1' is damaged. A laser process is required to form blind holes (that are formed where the conductors 15 are disposed). However, the laser process can form circular blind holes only, and the blind holes have poor quality.

Furthermore, since attaching the passive component 18' is achieved through non-conductive material and a dispensing method, the diameter of dispensing adhesive is larger than 200 μm and is difficult to control the volume of each dispensing adhesive, it is very easy for the insulating adhesive material 180' to spread to other areas, causing the wirings between each of the first wiring layer 11' to attach to the adhesive, thereby undesirably lowering the reliability.

After another two processes of making the dielectric material layer, the dielectric encapsulating layer 16' is formed by a lamination process, however as the first dielectric material layer 13 and the second dielectric material layer can be mistakenly placed, not only this increases the time and cost, because the passive component 18' has not yet been secured in place before baking the passive component 18', but also the passive component 18' may easily become displaced, causing a loss in yield.

In addition, using conductors 15 as a means to electrically connect the passive component 18' may increase the electrical pathway and signal loss, and the cost of using copper electrodes (MLCC) as the passive component 18' is also very high.

Therefore, there is an urgent need to solve the above-mentioned drawbacks of the conventional technology.

SUMMARY OF THE INVENTION

In view of the foregoing drawbacks, the present invention provides a package structure, which comprises: a first insulating layer having a first surface and a second surface opposing the first surface; a first wiring layer coupled to the first surface of the first insulating layer; a plurality of first conductors disposed in the first insulating layer and electrically connected with the first wiring layer; a second wiring layer formed on the second surface of the first insulating layer and electrically connected with the first wiring layer via the first conductors; a plurality of second conductors disposed on the second wiring layer; a second insulating layer formed on the second surface of the first insulating layer, encapsulating the second wiring layer and the second conductors, and having at least one opening for a portion of a surface of the second wiring layer to be exposed therefrom; and at least one electronic component received in the opening and electrically connected with the second wiring layer.

The present invention further provides a method of manufacturing a package structure, comprising: forming a first wiring layer on a carrier board; forming a plurality of first conductors on the first wiring layer; forming on the carrier board a first insulating layer that has a first surface and a second surface opposing the first surface, encapsulates the first wiring layer and the first conductors, and is coupled to the carrier board via the first surface of the first insulating layer; forming on the second surface of the first insulating layer a second wiring layer that is electrically connected with the first wiring layer via the first conductors; forming a plurality of second conductors on the second wiring layer; forming on the second surface of the first insulating a second insulating layer that encapsulates the second wiring layer and the second conductors; forming at least one opening on the second insulating layer, for a portion of a surface of the second wiring layer to be exposed therefrom; and disposing in the opening at least one electronic component that is electrically connected with the second wiring layer.

In summary, the package structure and method of manufacturing the same form two layers of wirings, and form an opening on a second insulating layer. Therefore, the regions that are not occupied by the second conductors are utilized effectively, and the overall size of the package structure is decreased. The additional second wiring layer can also increase the electrical performance and signal stability.

The present invention does not use a core board, and has a reduced size and a high layout usage rate.

The present invention does need to stack or laminate a substrate that already has an opening. Therefore, the electronic component will not be pressed to make a displacement, and can be securely positioned.

BRIEF DESCRIPTION OF DRAWINGS

The present invention can be more fully understood by reading the following detailed description of the preferred embodiments, with reference made to the accompanying drawings, wherein:

FIGS. 1A' to 1D' are cross-sectional views showing another method of manufacturing a conventional package structure;

FIGS. 2A to 2G are cross-sectional views showing a method of manufacturing a package structure according to the present invention; wherein FIGS. 2F' and 2F'' are different embodiments of FIG. 2F, and FIGS. 2G' and 2G'' are different embodiments of FIG. 2G;

DETAILED DESCRIPTION OF PREFERRED EMBODIMENTS

The present invention is described in the following with specific embodiments, so that one skilled in the pertinent art can easily understand other advantages and effects of the present invention from the disclosure of the present invention.

It should be noted that all the drawings are not intended to limit the present invention. Various modification and variations can be made without departing from the spirit of the present invention. Further, terms, such as "upper", "lower", "first", "second" and "one" etc., are merely for illustrative purpose and should not be construed to limit the scope of the present invention.

FIGS. 2A to 2F are cross-sectional view showing a method of manufacturing a package structure 2 according to the present invention.

Figure 1A:
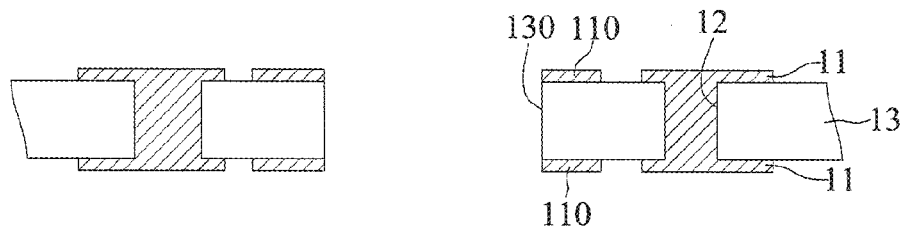
FIGS. 1A to 1D are cross-sectional views showing a method of manufacturing a conventional package structure.
Figure 1B:
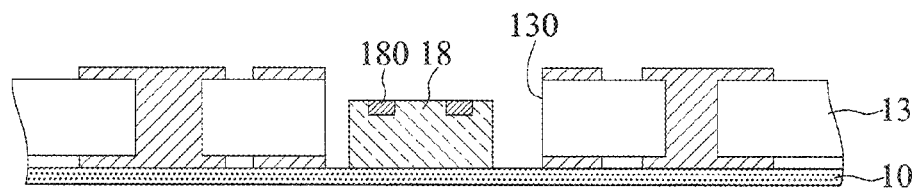
Figure 1C:
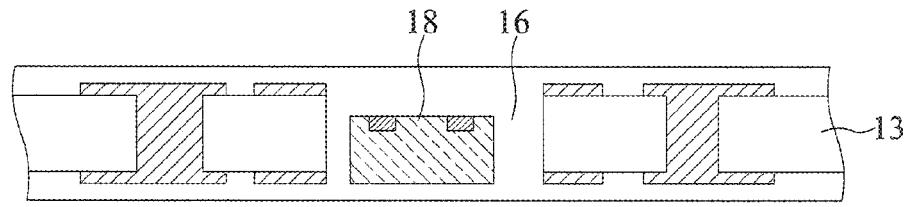
Figure 1D:
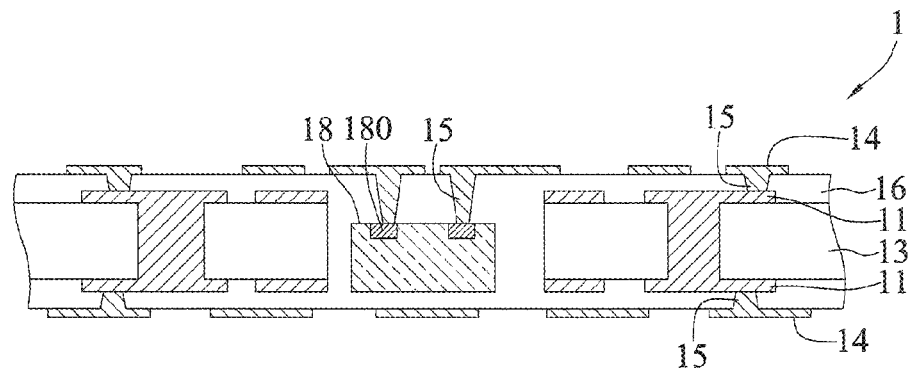
Figure 1A:
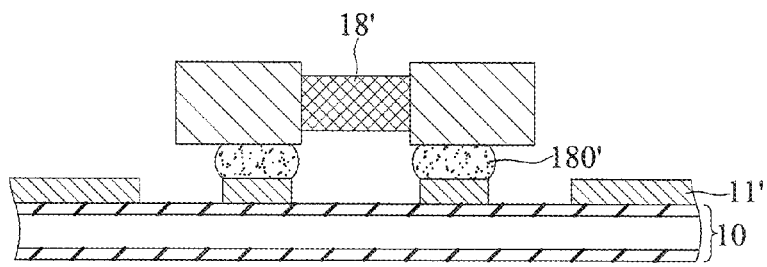
Figure 1B:
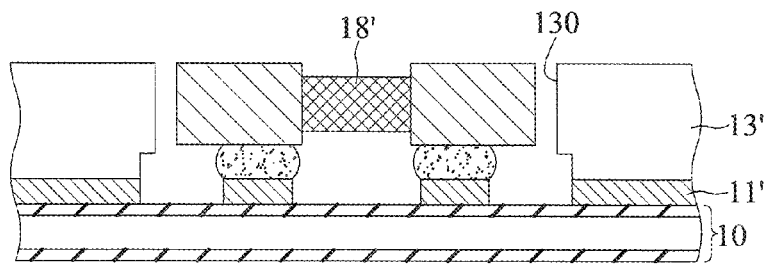
Figure 1C:
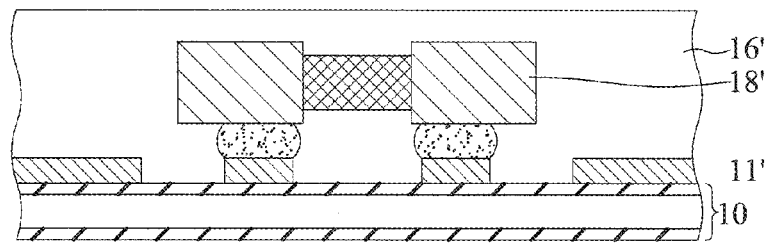
Figure 1D:
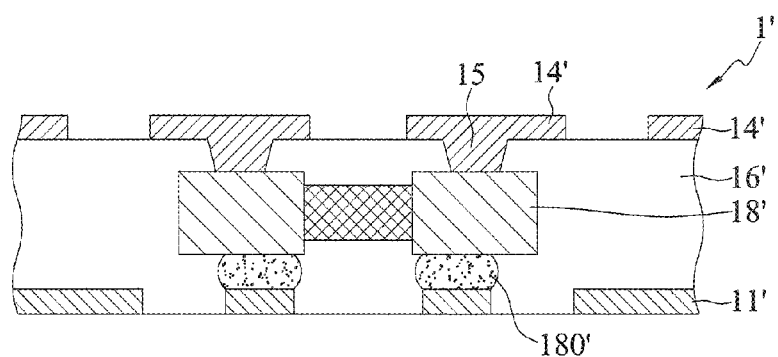
Figure 2A:
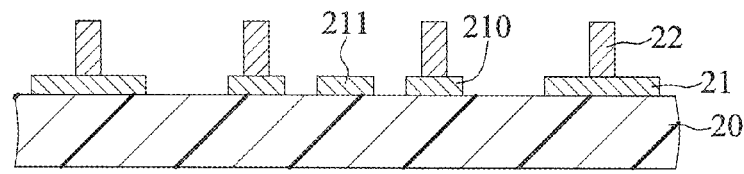

As shown in FIG. 2A, a first wiring layer 21a is formed on a carrier board 20 by a patterning process, and a plurality of first conductors 22 are subsequently disposed on the first wiring layer 21.

In an embodiment, the carrier board 20 is a substrate, such as a copper foil substrate or other types of boards, without any particular limitations.

The first wiring layer 21 comprises a plurality of electrical connection pads 210 and a plurality of conductive traces 211. In an embodiment, the first conductors 22 are conductive pillars such as copper pillars.

Figure 2B:
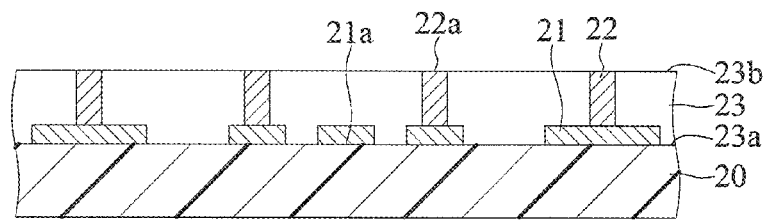

As shown in FIG. 2B, a first insulating layer 23 having a first surface 23a and a second surface 23b opposing the first surface 23a is formed on the carrier board 20. The first insulating layer 23 encapsulates the first wiring layer 21 and the first conductors 22.

The first insulating layer 23 is attached onto the carrier board 20 via the first surface 23a of the insulating layer 23.

In an embodiment, an end surface 22a of the first conductors 22 is exposed from the second surface 23b of the first insulating layer 23.

A surface 21a of the first wiring layer 21 is flush with the first surface 23a of the first insulating layer 23.

In an embodiment, the first insulating layer 23 is formed by a lamination or molding process.

Figure 2C:
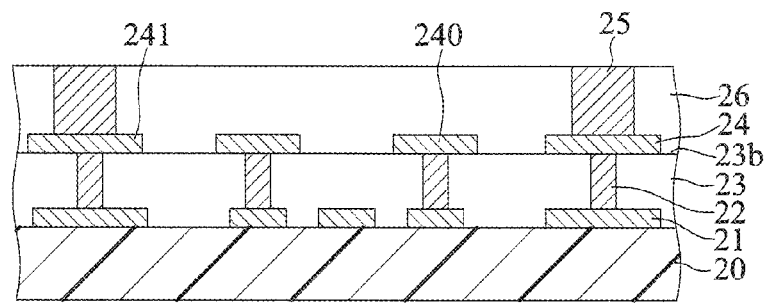

As shown in FIG. 2C, a second wiring layer 24 is formed on the second surface 23b of the first insulating layer 23. The second wiring layer 24 is electrically connected with the first wiring layer 21 via the first conductors 22. Subsequently, a plurality of second conductors 25 is disposed on the second wiring layer 24, and a second insulating layer 26 is formed on the second surface 23b of the first insulating layer 23. The second insulating layer 26 encapsulates the second wiring layer 24 and the second conductors 25.

In an embodiment, the second wiring layer 24 comprises a plurality of electrical contact pads 240 and a plurality of conductive traces 241, and the electrical contact pads 240 and the conductive traces 241 are directly connected with the first conductors 22

In an embodiment, the second conductors 25 are conductive pillars such as copper pillars, and an end surface of the second conductor 25 is exposed from the second insulating layer 26.

In an embodiment, the second insulating layer 26 is formed by a lamination or molding process.

Figure 2D:
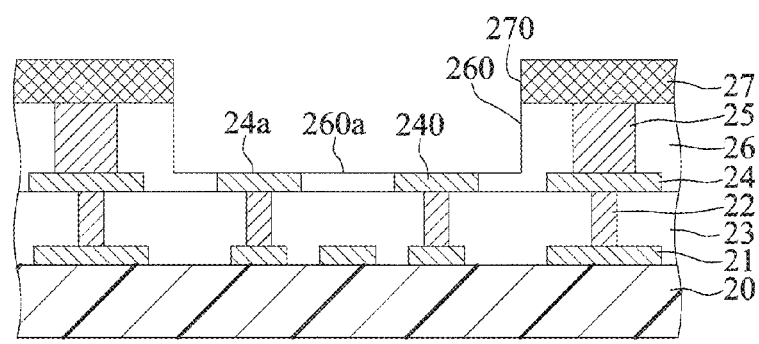

As shown in FIG. 2D, a resist layer 27 such as a photoresist layer is formed on the second insulating layer 26, and has at least one opening area 270, for a portion of the surface of the second insulating layer 26 to be exposed therefrom. Subsequently, at least one opening 260 is formed on the second insulating layer 26 of the opening area 270, for a portion of the surface of the second wiring layer 24 (i.e., electrical contact pads 240) to be exposed therefrom.

In an embodiment, the opening 260 is formed by a grinding process such as pumice, or a laser process, without using a conventional cutting process. Therefore, the opening 260 can be reduced in size at a corner position (such as bottom surface, opening position).

In an embodiment, the surface 24a of the second wiring layer 24 is flush with the bottom surface 260a of the opening 260.

Since the electrical contact pads 240 are not recessed due to damages by laser, cutter, or a drill, the surface integrity is well maintained.

As shown in FIG. 2E, the resist layer 27 is removed. In an embodiment, an end surface of the second conductors 25 is exposed from the second insulating layer 26. As a result, it is not necessary to make contact pads on the second conductors 25, such that the space among the second conductors 25 is utilized efficiently to form the opening 260.

As shown in FIG. 2F, the carrier board 20 is removed for exposing the first wiring layer 21 and the first insulating layer 23, and at least one electronic component 28 is accommodated in the opening 260 electrically connected with the second wiring layer 24, without being encapsulated within the first insulating layer 23 or the second insulating layer 26. The method according to the present invention does not use a conventional cutting method, and a distance between the electronic component 28 and a wall of the opening 260 can be reduced.

In an embodiment, the electronic component 28 can be an active component, a passive component, or a combination thereof. The active component can be a semiconductor element (such as a chip), and the passive component can be a resistor, a capacitor or an inductor. As shown in FIG. 2F, the electronic component 28 is a passive component such as a multi-layer ceramic capacitor (MLCC), which is formed by the current soldering process, without using copper electrodes of higher cost, so as to reduce the overall cost.

In an embodiment, the electronic component 28 is attached securely and electrically connected with the electrical contact pads 240 via the conductive material 280 (such as soldering material or conductive adhesive). Through limiting the size and shape of each of the electrical contact pads 240, the adhesive can be prevented from spreading to the adjacent electrical contact pads 240.

In another embodiment, as shown in FIG. 2F', the electronic component 28' is an active component, and a wiring can be additionally disposed among electrical contact pads 240 corresponding to the electronic component 28'.

As shown in FIG. 2F'', a plurality of electronic components 28a and 28b are formed on an uneven surface i.e., a step-like structure formed in the opening 260', so as to increase the 3D space. In an embodiment, the electronic component 28a is a passive component, and the electronic component 28b is an active component.

As shown in FIG. 2G, a plurality of conductive elements 29 such as solder balls are formed on the second insulating layer 26, and the conductive elements 29 are electrically connected with the second conductors 25. Other electronic devices (not shown) can be stacked or disposed on the electronic elements 29.

In an embodiment, more space is available through the installation of the conductive elements, and the electronic component 28 is prevented from making contact with other electronic devices. In an embodiment, according to the depth of the opening the surface 24a' of the second wiring layer 24' is higher than the bottom surface 260a of the opening 260, as shown in FIG. 2G'; alternatively, the surface 24a'' of the second wiring layer 24'' is lower than the bottom surface 260a of the opening 260, as shown in the embedded wiring of FIG. 2G''.

Figure 3:
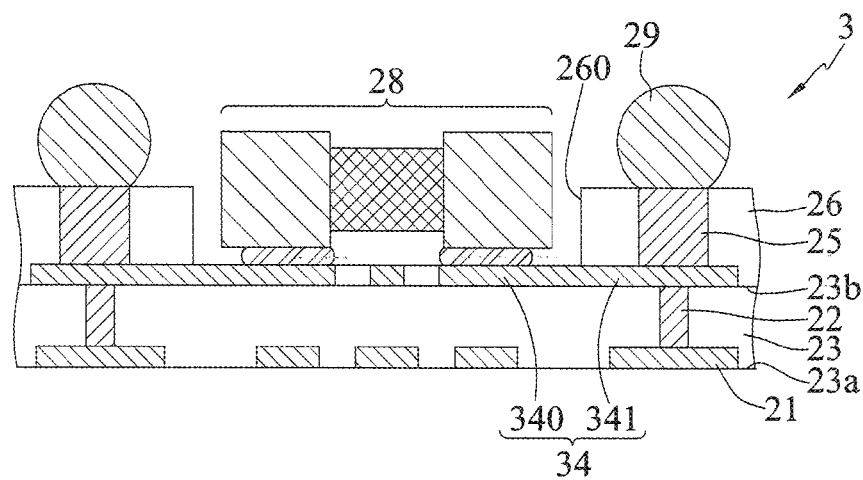
FIG. 3 is a cross-sectional view of a package structure of an embodiment according to the present invention.

In an embodiment, as shown in FIG. 3, the electrical contact pads 340 of the second wiring layer 34 are indirectly electrically connected with the first conductors 22 via the conductive traces 341. In other words, the electrical contact pads 340 are not directly connected with the first conductors 22.

Figure 4:
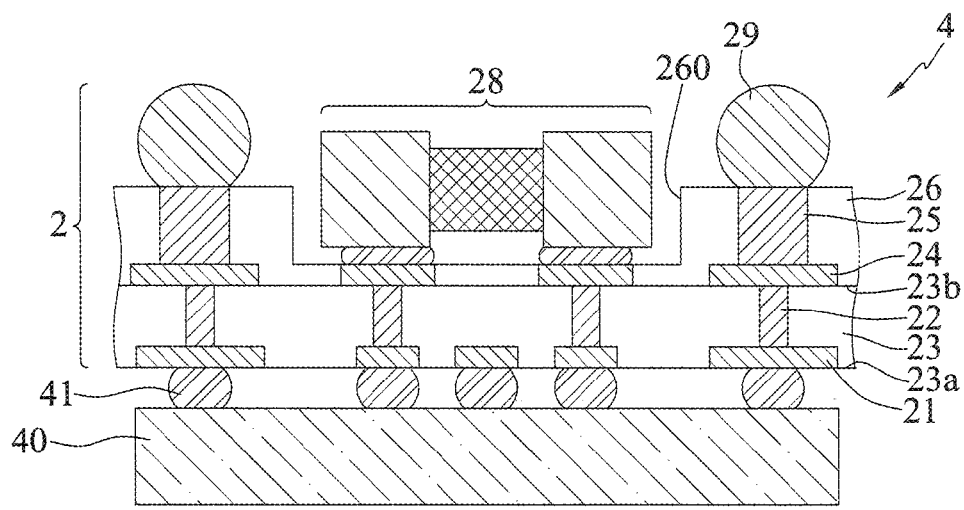
FIG. 4 is a cross-sectional view illustrating a subsequent process of FIG. 2G.

In a subsequent process, as shown in FIG. 4, another electronic component 40 is disposed on the first surface 23a of the first insulating layer 23 and electrically connected to the first wiring layer 21 through a plurality of conductive elements 41 such as solder balls.

In an embodiment, the another electronic component 40 is an active component, a passive components, or a combination thereof. The active component can be a semiconductor element (such as a chip), and the passive component can be a resistor, a capacitor or an inductor. The another electronic component 40 shown in FIG. 4 is an active component.

In an embodiment, an opening 260 can be formed among the second conductors 25, such that the 3D space can be fully utilized. This not only reduces the overall size (e.g., a thickness), but also increases the distribution area of the second wiring layer 24. Therefore, the electrical performance is increased with more stabilized signals.

Compared to conventional use of glassfiber as the dielectric material to form the embedded structure, the present invention does not use a core board, and the substrate can has its size reduced. As a result, the wiring layout area is increased in such a limited space.

In addition, the substrate with the opening does not required to be stacked or laminated, and the electronic component 28 can be prevent from being pressed and making displacement. Therefore, the electronic component can be more precisely secured in position, and the yield rate is increased.

Moreover, multiple dielectric material layers are required to be laminated to form the embedded electronic components in the method of manufacturing a conventional circuit board such as printed circuit board and ball grid array (BGA), hence it is easy that a mismatch will be resulted between the height of the embedded component and the thickness of the dielectric layer. Another way of forming the embedded electronic component is through forming a cavity, by mechanical molding machine or cutting method to form an opening for each cavity on the dielectric material layer, which is time consuming and expensive. The present invention has the advantage that it only requires a general surface mount technology (SMT) process, followed by a molding method, without the need of multiple processes for forming the openings. If the opening (such as opening 260) is formed on the outer later, only one time process is needed, such as using pumice, therefore the overall production time and cost can be greatly reduced, which is not possible in a conventional circuit board such as printed circuit board, or BGA.

The present invention further provides a package structure 2, 3, 4, which comprises a first insulating layer 23, a first wiring layer 21, a plurality of first conductors 22, a second wiring layer 24, 34, a plurality of second conductors 25, a second insulating layer 26, and at least one electronic component 28.

The first insulating layer 23 has a first surface 23a and second surface 23b opposing the first surface 23a.

The first wiring layer 21 is attached to the first surface 23a of the first insulating layer 23. In an embodiment, the first wiring layer 21 is embedded in the first surface 23 of the first insulating layer 23 and is flush with the first surface 23a.

In an embodiment, the first conductors 22 are conductive pillars, disposed in the first insulating layer 23, connected with the second surface 23b, and electrically connected with the first wiring layer 21.

The second wiring layer 24, 34 is formed on the second surface 23b of the first insulating layer 23, and electrically connected with the first wiring layer 21 via the first conductors 22.

The second conductors 25 are conductive pillars, and disposed on the second wiring layer 24.

The second insulating layer 26 is formed on the second surface 23b of the first insulating layer 23, encapsulates the second wiring layer 24 and the second conductors 25, and has at least one opening 260 formed thereon, for a portion of the surface of the second wiring layer 24 to be exposed therefrom.

The electronic component 28 is disposed in the opening 260 and electrically connected with the second wiring layer 24. In an embodiment, the electronic component 28, 28', 28a, 28b is an active components, a passive components, or a combination thereof.

In an embodiment, the surface 24a, 24a' of the second wiring layer 24, 24' is higher than or flush with the bottom surface 260a of the opening 260.

In an embodiment, the surface 24a" of the second wiring layer 24" is lower than the bottom surface 260a of the opening 260.

In an embodiment, the second wiring layer 24, 34 comprises a plurality of electrical contact pads 340, 340 and a plurality of conductive traces 341, 341 that are electrically connected with the electrical contact pads 240, 340. The electrical contact pads 240, 340 are attached and electrically connected to the electronic component 28. The electrical contact pads 24 are connected or are not connected with the first conductors 22, and the conductive traces 341 are connected to the first conductors 22

In an embodiment, the opening 260' has a step-like structure therein. In an embodiment, the package structure 2 further comprises a plurality of conductive elements 29 disposed on the second insulating layer 26 and electrically connected with the second conductors 25.

In an embodiment, the package structure 4 further comprises another electronic component 40 disposed on the first surface 23a of the first insulating layer 23 and electrically connected to the first wiring layer 21.

The present invention has been described using exemplary preferred embodiments. However, it is to be understood that the scope of the present invention is not limited to the disclosed embodiments. On the contrary, it is intended to cover various modifications and similar arrangements. The scope of the claims, therefore, should be accorded the broadest interpretation so as to encompass all such modifications and similar arrangements.

The invention claimed is:

1. A package structure, comprising:
a first insulating layer with a molding material having a first surface and a second surface opposing the first surface;
a first wiring layer coupled to the first surface of the first insulating layer;
a plurality of copper pillars disposed in the first insulating layer and electrically connected with the first wiring layer;
a second wiring layer formed on the second surface of the first insulating layer and electrically connected with the first wiring layer via the copper pillars;
a plurality of second conductors disposed on the second wiring layer;
a second insulating layer with a molding material formed on the second surface of the first insulating layer, encapsulating the second wiring layer and the second conductors, and having at least one opening for a portion of a surface of the second wiring layer to be exposed therefrom, wherein the opening has a step-like structure therein; and
a plurality of electronic components disposed in the opening, wherein at least one of the electronic components is bonded on a bottom of the opening and electrically connected with the second wiring layer, and another of the electronic components is bonded on a step surface of the step-like structure and electrically connected with the second wiring layer.

2. The package structure of claim 1, wherein the first wiring layer is embedded in the first surface of the first insulating layer.

3. The package structure of claim 1, wherein the copper pillars are conductive pillars.

4. The package structure of claim 1, wherein the second conductors are conductive pillars.

5. The package structure of claim 1, wherein the surface of the second wiring layer is higher than or flush with a bottom surface of the opening.

6. The package structure of claim 1, wherein the surface of the second wiring layer is lower than or flush with a bottom surface of the opening.

7. The package structure of claim 1, wherein the second wiring layer comprises a plurality of electrical contact pads and a plurality of conductive traces, and the electrical contact pads are coupled to and electrically connected with the electronic component.

8. The package structure of claim 7, wherein the electrical contact pads are connected with the copper pillars.

9. The package structure of claim 7, wherein the electrical contact pads are not connected with the copper pillars, and the conductive traces are connected with the copper pillars.

10. The package structure of claim 1, wherein the electronic component is an active component, a passive component, or a combination thereof.

11. The package structure of claim 1, further comprising a plurality of conductive elements disposed on the second insulating layer and electrically connected with the second conductors.

12. The package structure of claim 1, further comprising another electronic component disposed on the first surface of the first insulating layer and electrically connected to the first wiring layer.

* * * * *